United States Patent [19]

Galli et al.

[11] Patent Number: 4,694,424

[45] Date of Patent: Sep. 15, 1987

[54] COMBINED NUCLEATE-REPLICATE SINGLE WALL DOMAIN GENERATE STRUCTURE

[75] Inventors: Guido Galli, Saratoga; Alexander A. Grillo, Cupertino; Barry R. Lieberman, Los Altos, all of Calif.

[73] Assignee: Magnesys, San Jose, Calif.

[21] Appl. No.: 782,743

[22] Filed: Oct. 1, 1985

[51] Int. Cl.[4] ............................................... G11C 19/08
[52] U.S. Cl. ......................................... 365/12; 365/11
[58] Field of Search .................................... 365/11, 12

[56] References Cited

U.S. PATENT DOCUMENTS 3,611,331 10/1971 Bonyhard ........................... 340/174
4,272,817 6/1981 Rose ..................................... 365/12

OTHER PUBLICATIONS

IBM Technical Disclosure Bulletin–vol. 24, No. 11A, Apr. 1982, p. 5762.

Primary Examiner—James W. Moffitt
Attorney, Agent, or Firm—Townsend & Townsend

[57] ABSTRACT

A bubble generator for use in a bubble memory device combines a nucleating generator and replicating generator in a unified structure with first and second hairpins disposed at respective first and second regions to define nucleation and replication sites. The conductor layer is configured such that the same polarity of current flow causes magnetic fields of opposite sense at the nucleation and replication sites. The nucleation site is used only to generate the seed bubble required at the replication site. Once the seed bubble is present, the replication site is utilized to produce the data stream. The nucleation and replication sites are preferably spaced apart with a propagation track extending from the former to the latter, and the first and second hairpins are series-connected with the series connection crossing the propagation path. The hairpins are preferably directed oppositely so that when the rotating field is in the right phase for replication, it is 180° out of phase for nucleation.

13 Claims, 5 Drawing Figures

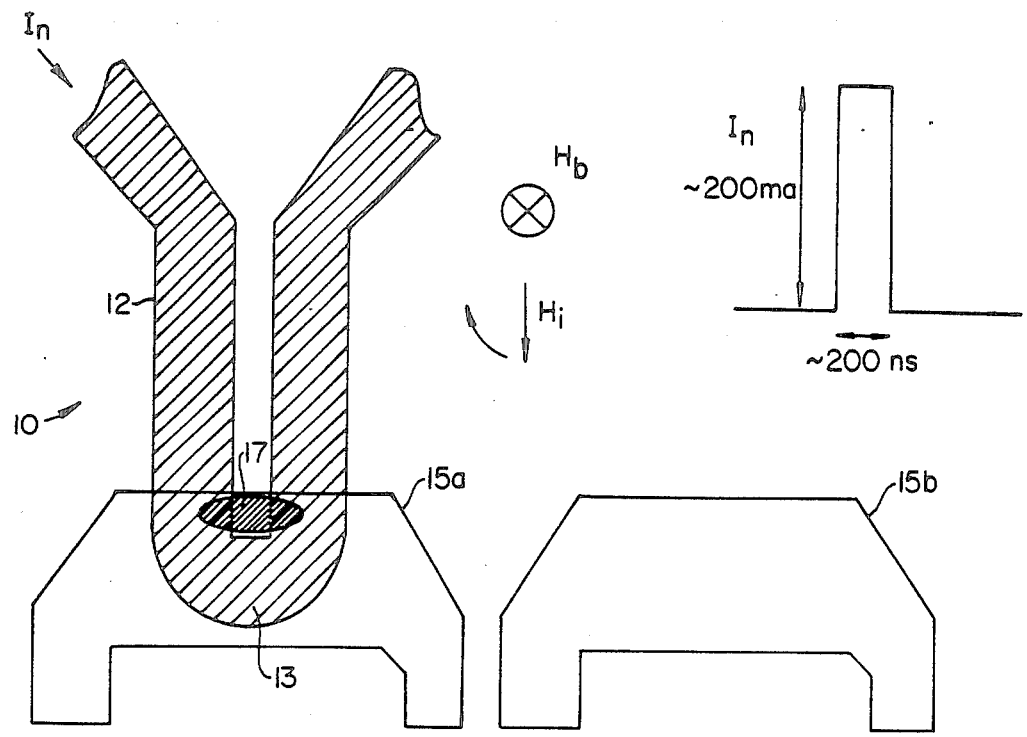
FIG.__1.
(PRIOR ART NUCLEATING GENERATOR)

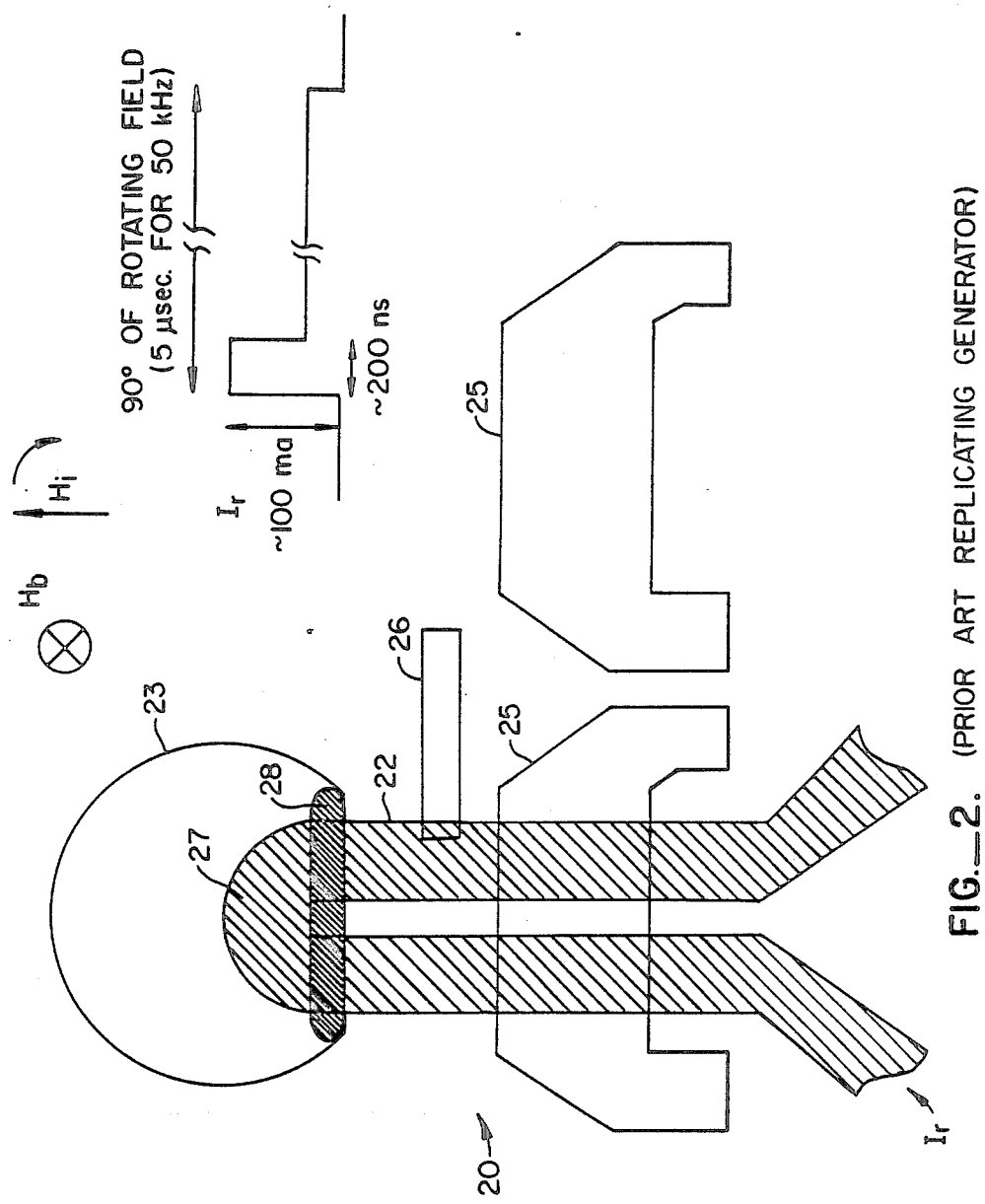
FIG.–2. (PRIOR ART REPLICATING GENERATOR)

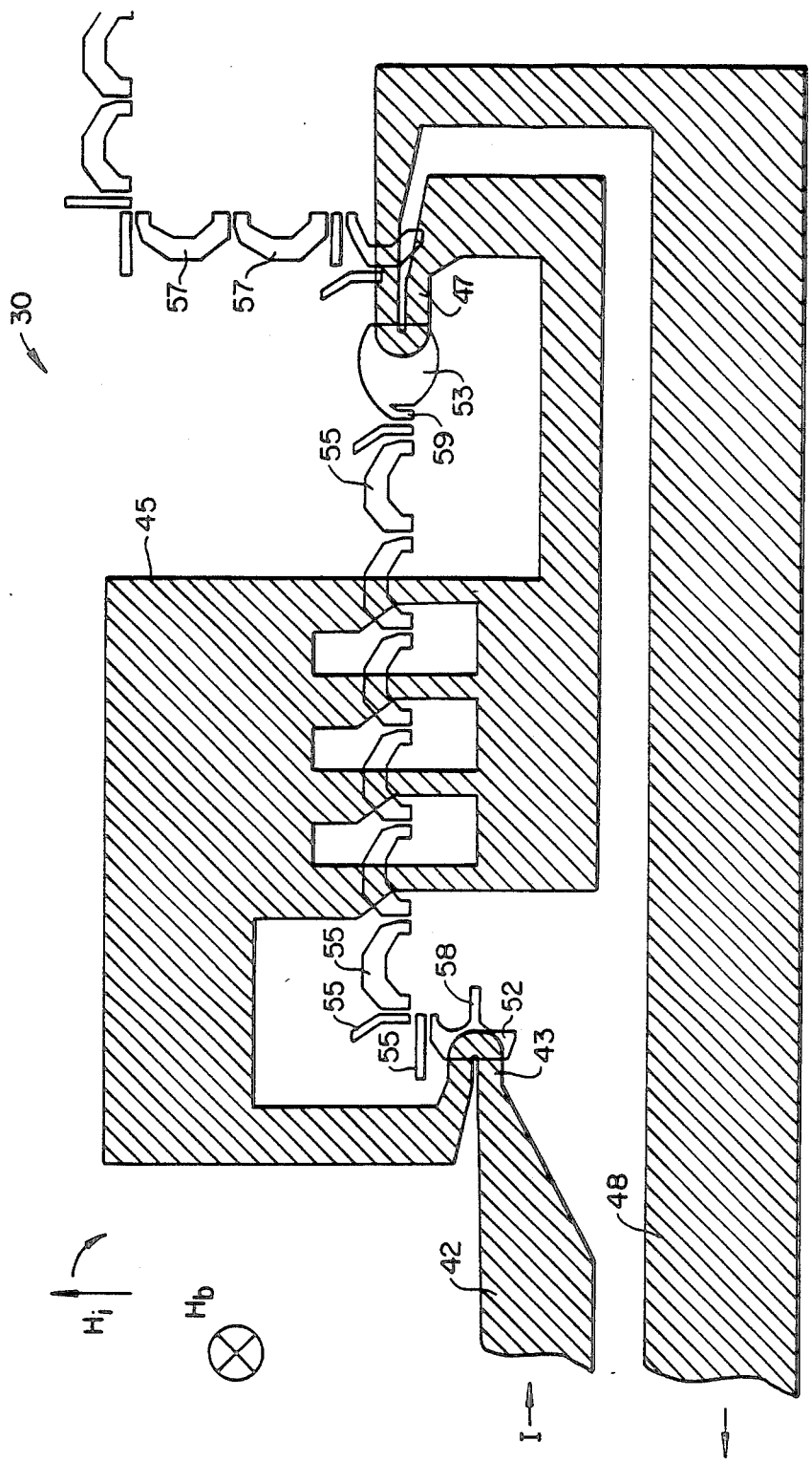
FIG._3.

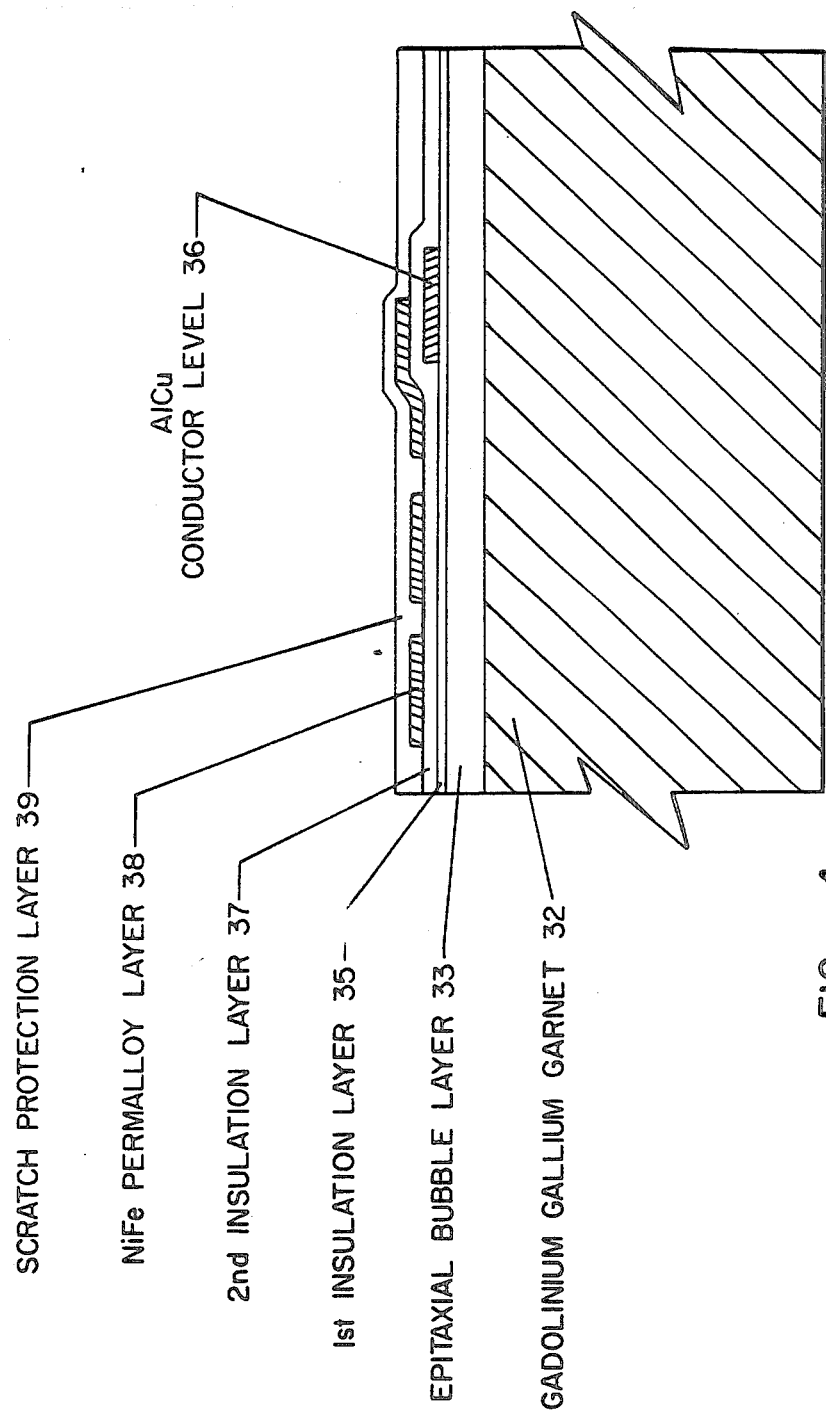

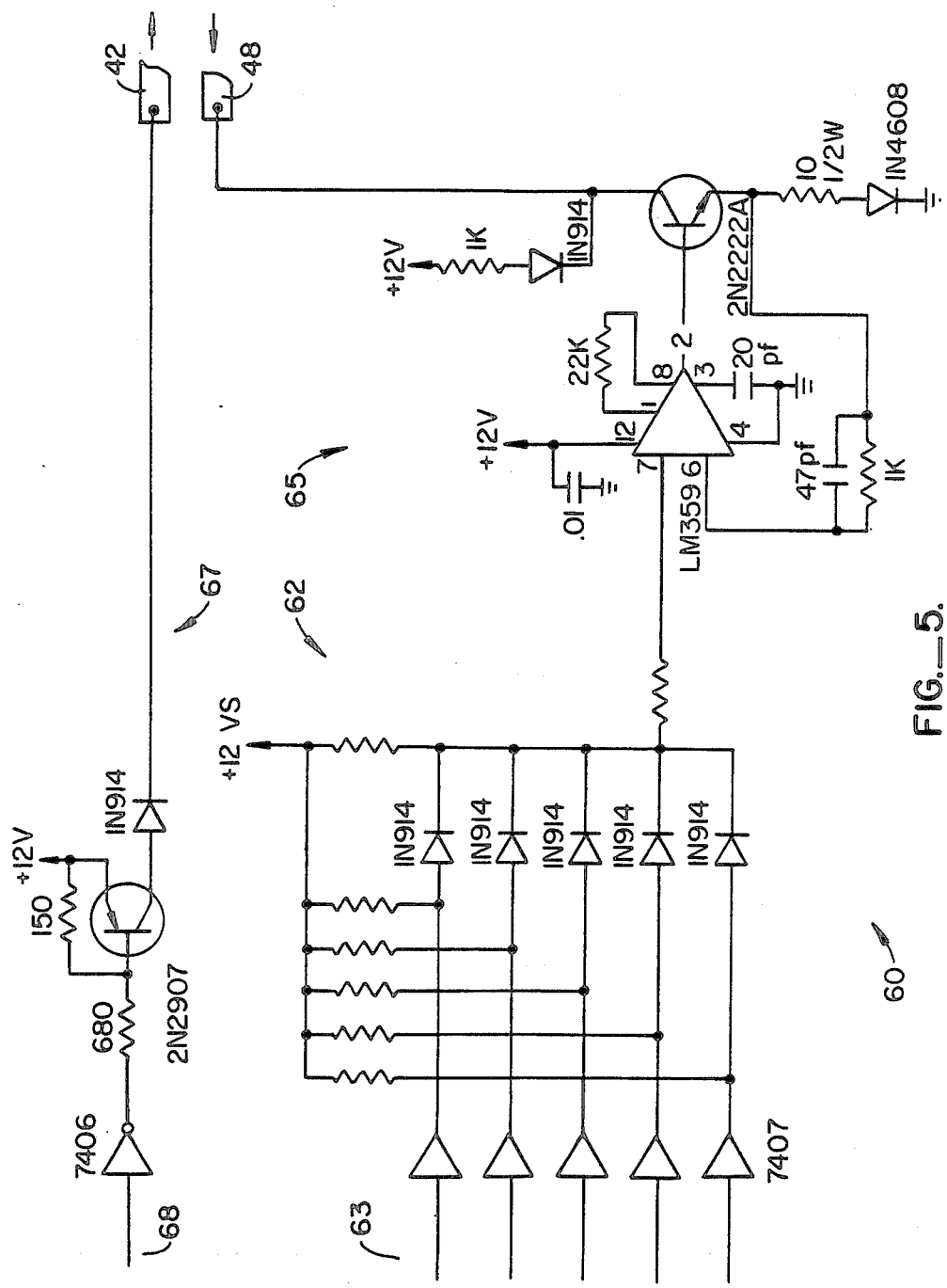
FIG._5.

COMBINED NUCLEATE-REPLICATE SINGLE WALL DOMAIN GENERATE STRUCTURE

FIELD OF THE INVENTION

The invention relates generally to magnetic bubble memories and more specifically to a structure for generating magnetic bubble domains in such a memory device.

BACKGROUND OF THE INVENTION

In bubble memory devices, a serially ordered sequence of single wall magnetic domain positions represents bits of binary data. The distinction between binary "0's" and "1's" at a particular bit position in the sequence is represented by the corresponding presence or absence of a single wall domain (called a bubble).

Magnetic bubble technology provides a non-volatile, reliable, rugged, storage medium with high storage capability. A typical bubble memory device is fabricated by depositing an epitaxial thin film of magnetic material on a non-magnetic garnet wafer, and then forming lithographically patterned layers of a non-magnetic conductor (such as aluminum-copper alloy) and a high-permeability, low coercivity material (such as permalloy), with suitable insulation therebetween. The non-magnetic conductor is normally located between the thin film and the high-permeability layer. The device is packaged with permanent magnets that provide a static magnetic field (the bias field) oriented perpendicular to the film and coils that provide a rotating magnetic field in the plane of the film. A typical rotation rate is about 50–100 kHz.

The magnetic thin film has a crystallographic orientation such that small cylindrical magnetic domains (bubbles) are created by the action of the bias field. The bubbles are magnetized oppositely to the bias field while the much larger domain surrounding the bubbles is magnetized in the same direction as the field. The bubbles may be made to circulate by energizing the coils for the rotating field. The lithographically patterned layer of high-permeability material controls the movement of the bubbles in a precise fashion. The high-permeability material is deposited in a pattern of small chevrons or the like, referred to as propagators, to define the bubble paths.

A typical bubble memory architecture comprises a number of storage loops, an input track, and an output track. A bubble generator is coupled to the input track and injects bubbles that propagate to be exchanged into the loops to effect writing. A bubble detector is coupled to the output track and detects bubbles that are exchanged between the loops and the output track to effect reading.

Commercial magnetic bubble memory devices have used one of two techniques to generate bubbles, namely nucleation and replication.

FIG. 1 is a plan schematic illustrating a nucleating generator 10 according to known practice. Nucleating generator 10 comprises a U-shaped or hairpin conductor 12 (referred to as "hairpin 12") having a loop portion 13 overlapping a first propagator 15a at the beginning of a propagation track that comprises a plurality of propagators 15a, 15b, etc. In the illustration, the bias field, designated $H_b$, is directed into the page and the rotating in-plane field, designated $H_i$, is shown as a vector rotating clockwise. In operation, a nucleation current pulse, designated $I_n$, is injected into hairpin 12 in a direction such that the magnetic field at the center of the loop is attractive for the bubble domain, that is, locally opposing the bias field $H_b$ at the center of the loop. The current pulse is injected into hairpin 12 at the time when the in-plane field $H_i$ is directed along the hairpin axis between the hairpin conductors, in a direction toward the loop portion (as indicated by the vector direction in the figure). A bubble 17 is nucleated at the center of the loop if the pulsed nucleation current is of sufficient magnitude. Although the required current magnitude depends on various device parameters and temperatures, a 200 milliamp, 200 nanosecond pulse is typical for room temperature operation. The nucleated bubble then proceeds down the propagation track as the in-plane field $H_i$ rotates.

FIG. 2 is a plan schematic of a replicating generator 20 according to known practice. Replicating generator 20 comprises a hairpin 22, a high permeability seed patch 23, a plurality of high permeability propagators 25, and a high permeability bar 26. Hairpin 22 is disposed with its loop portion 27 overlapping seed patch 23 and the hairpin conductors extending toward and crossing over the line of propagators 25.

The basic operation of replicating generator 20 is to cut or replicate a preexisting seed bubble that is present at seed patch 23 and then to transfer the cutoff portion to propagators 25. In operation, a replication current pulse, designated $I_r$, is injected into hairpin 22 in a direction such that the magnetic field due to the current reinforces the bias field $H_b$ at the center of loop portion 27. The current is injected at the time that the in-plane field is passing through the phase indicated (as with nucleating generator 10). The seed bubble is stretched across the hairpin, the bubble in such stretched configuration being designated 28. The seed bubble is cut into two separate bubbles by the pulsed current $I_r$ if the current is sufficient to flip the magnetization at the hairpin center to create new domain walls. The required current magnitude depends on device parameters, but is typically 100 milliamps for 200 nanoseconds, and is largely temperature independent. The current through the hairpin is then reduced (typically to about 30 milliamps) for 90° of field rotation. This pins the trailing part of the replicated bubble along the right outside edge of the hairpin so that as the in-plane field rotates 90°, the trailing part of the replicated bubble transfers to bar 26. As the field rotates another 90° (pointing up in the figure), the bubble transfers to the propagation track. The leading portion of the replicated bubble remains on the seed patch so that it can be replicated again.

The known practice in the magnetic bubble field is to use one of these two types of generators. Each of the two bubble generation techniques has advantages and disadvantages, with the advantages of one representing the disadvantages of the other. This latter fact is not lost on the manufacturers of commercially available bubble memories, who are wont to tout the advantages of the type of generator present in their products, and are careful to point out the disadvantages of the other type.

The nucleating generator suffers from the disadvantage that its current must be temperature compensated. That is, extra circuitry must be provided to vary the nucleation current amplitude as a function of temperature to insure reliable operation over the temperature range of the device. Also, the nucleating generator is the most likely portion of the bubble memory to suffer a wear-out failure. This is because it is pulsed at a high repetition rate (once for every bubble that needs to be generated) and requires a current density in the hairpin of about twice that of a replicating generator.

On the other hand, the replicating generator must incorporate a mechanism for creating the seed bubbles (the discussion above regarding the replicating generator assumes that a seed bubble exists). This can be accomplished by operating the replicating generator in a nucleating generator mode by reversing the current polarity relative to that used for replication, but this requires additional control circuitry or dual-polarity power supplies in the system. As a result, loss of the seed bubble after the device is installed in an end user environment requires special maintenance procedures to restore functionality.

Depending on the particular device and system requirements, the particular disadvantages of one type of generator may be less of a problem than those of the other. In any event, the practice is to select the type of generator whose disadvantages are likely to be less disruptive for the particular application. To the extent that there is a significant reason to prefer one or the other, the non-chosen type of generator would be especially unsuitable.

SUMMARY OF THE INVENTION

The present invention provides a bubble generator structure that substantially eliminates the problems associated with the nucleating generator and replicating generator. The generator of the present invention does not normally require temperature compensation, operates at relatively low current densities for normal data generation, and requires but a single polarity of circuitry for the power supplies.

In broad terms, the present invention contemplates combining a nucleating generator and replicating generator in a unified structure with first and second hairpins disposed at respective first and second regions to define nucleation and replication sites. The conductor layer is configured such that the same polarity of current flow causes magnetic fields of opposite sense at the nucleation and replication sites. The nucleation site is used only to generate the seed bubble required at the replication site. Once the seed bubble is present, the replication site is utilized to produce the data stream.

In the preferred embodiment, the nucleation and replication sites are spaced apart with a propagation track extending from the former to the latter, and the first and second hairpins are series-connected with the series connection crossing the propagation path. The hairpins are preferably directed oppositely so that when the rotating field is in the right phase for replication, it is 180° out of phase for nucleation.

A further understanding of the nature and advantages of the present invention may be realized by reference to the remaining portions of the specification and the attached drawings.

BRIEF DESCRIPTION OF THE DRAWINGS

FIG. 1 is a plan schematic of a prior art nucleating generator;

FIG. 2 is a plan schematic of a prior art replicating generator;

FIG. 3 is a plan schematic of a bubble generator according to the present invention;

FIG. 4 is a representative cross-sectional view of the bubble generator; and

FIG. 5 is a circuit schematic of a current source suitable for use with the bubble generator.

DESCRIPTION OF THE PREFERRED EMBODIMENT

Bubble Generator Structure

FIG. 3 is a plan schematic illustrating a magnetic bubble generator 30 according to the present invention. FIG. 4 is a representative cross-sectional view. Generator 30 occupies a small portion of a bubble memory chip; the remaining portions of the chip form no part of the present invention and will not be described.

In accordance with standard practice, generator 30 is fabricated by depositing a number of layers on a garnet wafer 32. These include: a magnetic thin film 33; a first insulation layer 35; a lithographically patterned layer 36 of non-magnetic conductor; a second insulation layer 37; a lithographically patterned layer 38 of high-permeability, low-coercivity material; and a passivation layer 39. Once a patterned layer is formed, the overlying layers are in general stepped rather than flat. Nevertheless, any of the layers, whether stepped or flat, can be regarded as lying generally in a plane parallel to the plane of the magnetic thin film. Although the specific materials and layer thicknesses are not part of the invention, they will now be described. Clearly, other suitable materials will be evident to those skilled in the art.

Magnetic thin film 33 is preferably an epitaxial layer of iron garnet, having a thickness of about 1.5–3 microns. The magnetic film is the medium in which bubbles are formed and propagated.

First insulation layer 35 is preferably evaporated Schott glass, and has a thickness of about 0.05–0.3 microns (500–3000 angtroms). This layer serves to protect underlying magnetic thin film 33 during deposition of the overlying layer of conductor and provides an additional degree of freedom in the design. Other insulating materials such as spin-on glass, high temperature polymer, CVD oxide or nitride, or sputtered oxide could also be used.

Layer 36 is preferably an alloy of aluminum and copper, and has a thickness of about 0.4–0.6 microns (4000–6000 angstroms). For convenience, layer 36 of non-magnetic conductor will be referred to as conductor layer 36. Other non-magnetic conductors such as gold could also be used.

Second insulation layer 37 is preferably DuPont's "Polyimide," a high-temperature polymer, and has a thickness of about 0.4–0.6 microns (4000–6000 angstroms). This layer provides electrical insulation between conductor layer 36 and overlying layer 38. It also smooths out the steps of the conductor material so that it presents a relatively smooth surface for layer 38.

High permeability layer 38 is preferably permalloy (an alloy containing about 81% nickel and 19% iron), and has a thickness of about 0.5–0.6 microns (5000–6000 angstroms). This layer provides the propagators that control the bubble movement. For convenience, layer 38 of high-permeability material will be referred to as permalloy layer 38.

In the plan schematic, only conductor layer 36 and permalloy layer 38 are shown; the conductor layer is cross-hatched and the permalloy layer is unhatched (except where it overlaps the conductor layer). The bias field, designated $H_b$, is directed into the page and the rotating-in plane field designated $H_i$, is shown as a vector rotating clockwise.

Conductor layer 36 defines a single sinuous conductor that comprises an input leg 42, a first hairpin 43, a series connection leg 45, a second hairpin 47, and an output current leg 48. Each of the hairpins is U-shaped with the two parallel straight portions joined by a loop portion. The axis of the hairpin may be defined as the line parallel to the straight portions and midway between them. When current flows through such a hairpin, the magnetic field is maximum at the center of the loop.

Permalloy layer 38 comprises a pattern of discrete elements that include a nucleation element 52, a seed patch 53, a first plurality of propagators 55 extending from nucleation element 52 to seed patch 53, and a second plurality of propagators 57 extending from the vicinity of seed patch 53 to the remaining portions of the bubble memory (not shown).

Nucleation element 52 partially overlaps the loop portion of hairpin 43, and cooperates with the hairpin to provide a bubble nucleation site when sufficient current of the right polarity flows in hairpin 43 at the right time. Nucleation element 52 is configured with a narrow extension 58, which is located outside hairpin 43 and extends along the hairpin axis away from the hairpin. The length of extension 58 is chosen to define the amount of current required for nucleation.

Seed patch 53 partially overlaps the loop portion of hairpin 47, and cooperates with the hairpin to provide a site for replication of a seed bubble (if one exists) when sufficient current of the right polarity flows at the right time. Seed patch 53 is configured with a hook-like portion 59 that extends back toward propagators 55. Hook-like portion 59 functions to merge a bubble arriving at seed patch 53 with any seed bubble that might already be present.

Conductor layer 36 is configured so that when current flows from input leg 42 to output leg 48, the magnetic field at the center of hairpin 43 is oriented oppositely to bias field $H_b$ and the magnetic field at the center of hairpin 47 is oriented in the same direction as the bias field. That is, for the bias field directed into the page, the current flow is counterclockwise through hairpin 43 and clockwise through hairpin 47. In the preferred embodiment, this is accomplished by a configuration where series connector portion 45 crosses under the first propagation track. Although the technique for providing such a crossing between a propagation track and a conductor path is not a part of the invention, it is noted that the conductor path is split into a number of parallel traces, and each trace crosses under a one of a corresponding number of adjacent propagator elements, thereby limiting the local magnetic fields in the crossing region.

As noted above, the hairpins are connected so that when current flows from input leg 42 to output leg 48, the magnetic fields at the respective hairpin centers caused by such current flow are oppositely directed. In addition, the hairpins are preferably oppositely directed with hairpin 43 opening to the left and hairpin 47 to the right. The significance of this will be discussed below.

Bubble Generator Operation

The operation of generator 30 is characterized by operation in a nucleation mode in order to form a bubble at nucleation site 52, propagation of such bubble to seed patch 53, and subsequent operation of the generator in a replication mode to replicate bubbles from the bubble at seed patch 53.

More specifically, consider an initial state where no seed bubble exists at the replication site. To create a seed bubble, a single nucleate current pulse of sufficient magnitude is caused to flow between input leg 42 and output leg 48 when rotating field $H_i$ is pointing to the right, thereby causing a bubble to be nucleated at the nucleation site. The nucleated bubble is propagated along the first propagation track by the action of the rotating field, until it encounters seed patch 53. Once the bubble reaches the seed patch, it remains there for subsequent replication.

To replicate the seed bubble, a stepped cut-and-transfer pulse of the same polarity is caused to flow between input leg 42 and output leg 48. The cut portion of the pulse is initiated when the rotating field $H_i$ is pointing to the left so that it has positioned the seed bubble under hairpin 47. The transfer portion of the pulse follows and remains for 90° of field rotation. The replicated bubble is then propagated along the second propagation track by the action of the rotating field. The cut portion amplitude is about half the nucleate pulse amplitude. The transfer portion amplitude is about a third of the cut portion amplitude.

As discussed above, hairpins 43 and 47 are oppositely directed. Thus, when $H_i$ is in the right phase for replication, it is precisely in the wrong phase for nucleation, and vice versa. Thus, it is virtually impossible for extra seed bubbles to be nucleated during the replication operation. In any event, since the current required for nucleation is a factor of two or more greater than that for replication, such spurious nucleation would be rare. Moreover, hook-like portion 59 on seed patch 53 would merge any spuriously nucleated bubble arriving at the seed patch with the pre-existing seed bubble, thereby preventing more than one seed bubble from being present.

Bubble generator 30 does not require temperature compensation in normal operation, since the normal generation is by replication, where the required current is generally temperature-independent. Nucleation is only required in those relatively rare circumstances where the seed bubble is lost. To the extent that temperature effects would interfere with nucleating the seed bubble, it would only be necessary to return the device to room temperature.

CURRENT GENERATOR

FIG. 5 is a circuit schematic illustrating a digitally programmable current source that may be used to supply the current for replication and nucleation as described above. The particular type of current source is not a part of the invention, and will not be described in detail. It is noted, however, that circuitry includes three main portions: namely a network 62 for converting a TTL digital code at its inputs 63 to a representative current, a current amplifier 65 for providing the desired current level, and a switching portion 67 for steering current to the bubble generator in response to TTL pulse at its input 68.

Conclusion

In conclusion, it can be seen that the present invention avoids most of the problems of prior art bubble generators. The generator of the present invention need not be temperature compensated, operates normally at low current, and does not require complicated current sources or special maintenance procedures.

While the above is a full description of the preferred embodiment of the present invention, alternate constructions, modifications, and equivalents may be employed. For example, while the current conductor is shown as crossing under the first propagation track, other topologies are possible, although not likely to be as efficient. Additionally, the particular shapes of the propagator elements reflect a particular design choice, but shapes other than the slightly asymmetric chevrons could also be used. Therefore, the above description should not be taken as limiting the scope of the invention, which is defined by the appended claims.

What is claimed is:

1. A magnetic bubble memory comprising:
 a thin film of magnetic material capable of supporting single wall magnetic domains, called bubbles, under the influence of a magnetic bias field perpendicular to said thin film, which bubbles may be used to represent bits of digital information;
 a patterned layer of high permeability material extending generally parallel to the path of said thin film for providing a propagation path for said bubbles to move under the influence of a rotating magnetic field in the plane of said thin film; and
 a patterned layer of electrically conductive material formed to define a conduction path generally parallel to the plane of said thin film and including a first U-shaped portion disposed at a first site and a second U-shaped portion disposed at a second site such that an injection of current in a predetermined sense into said layer of electrically conductive material results in a magnetic field at said first site that is attractive for said bubbles and a magnetic field at said second site that is repulsive for said bubbles;
 whereupon said injection of current in a predetermined sense is effective to cause bubble nucleation at said first site and bubble replication at said second site, depending on the magnitude of the injected current and the timing of the injected current relative to the phase of the rotating magnetic field.

2. The invention of claim 1 wherein:
 said first and second U-shaped portions are series-connected by a connection portion;
 said layer of high-permeability material includes a propagation track extending from said first site to said second site; and
 said connection portion crosses said propagation track.

3. The invention of claim 1 or 2 wherein said first and second U-shaped portions are oppositely directed so that when the rotating magnetic field is in the right phase for replication at said second site, it is 180° out of phase for nucleation at said first site.

4. The invention of claim 1 wherein said layer of high-permeability material includes an element at said first site where nucleation can occur.

5. The invention of claim 1 wherein said layer of high permeability material includes a seed patch element at said second site that serves both as a site of bubble replication and as a site that receives and retains bubbles for subsequent replication.

6. The invention of claim 1 wherein said layer of conductive material is located between said thin film and said layer of high-permeability material.

7. The invention of claim 1 wherein:
 said conductive material is an aluminum alloy; and
 said high-permeability material is permalloy, a nickel-iron alloy.

8. A magnetic bubble memory comprising:
 a thin film of magnetic material capable of supporting magnetic bubble domains therein under the influence of a magnetic bias field oriented perpendicular to said thin film;
 a patterned layer of high-permeability material lying generally in a plane parallel to the plane of said thin film, and including portions defining a nucleation site, a seed patch, a first propagation track extending from said nucleation site to said seed patch, and a second propagation track extending away from said seed patch; and
 a patterned layer of electrically conductive material defining a current path generally parallel to the plane of said thin film and including a first U-shaped portion proximate said nucleation site, a second U-shaped portion proximate said seed patch, and a series connection portion between said first and second U-shaped portions, such that injection of current in a predetermined sense into said layer of electrically conductive material results in a magnetic field at said nucleation site that is attractive for magnetic bubble domains and a magnetic field at said seed patch that is repulsive for magnetic bubble domains.

9. The invention of claim 8 wherein said series connection portion crosses said first propagation track.

10. The invention of claim 8 wherein said first and second U-shaped portions are oppositely directed.

11. The invention of claim 8 wherein said layer of conductive material is located between said thin film and said layer of high-permeability material.

12. The invention of claim 8 wherein:
 said conductive material is an aluminum alloy; and
 said high-permeability material is permalloy, a nickel-iron alloy.

13. The invention of claim 8 wherein said seed patch is configured with a hook-like portion extending toward said first propagation track for merging any bubbles arriving at said seed patch with any bubble already present at said seed patch.

* * * * *